(12) United States Patent
Edgar (10) Patent No.: US 7,115,932 B2
(45) Date of Patent: Oct. 3, 2006

(54) SEMICONDUCTOR DEVICE INCORPORATING AN ELECTRICAL CONTACT TO AN INTERNAL CONDUCTIVE LAYER AND METHOD FOR MAKING THE SAME

(75) Inventor: Todd Edgar, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 531 days.

(21) Appl. No.: 10/044,178

(22) Filed: Jan. 10, 2002

(65) Prior Publication Data

US 2002/0060335 A1 May 23, 2002

Related U.S. Application Data

(60) Continuation of application No. 09/971,242, filed on Oct. 4, 2001, now Pat. No. 6,410,380, which is a continuation of application No. 09/565,900, filed on May 5, 2000, now abandoned, which is a division of application No. 09/317,703, filed on May 24, 1999, now abandoned, which is a division of application No. 08/881,737, filed on Jun. 24, 1997, now Pat. No. 5,970,340.

(51) Int. Cl.
*H01L 27/108* (2006.01)

(52) U.S. Cl. ............... 257/301; 257/303; 257/304; 257/306; 257/309; 257/E27.092

(58) Field of Classification Search ........... 257/301, 257/303, 304, 305, 306, 307, 308, 309; 438/253, 438/396, 254–256, 243–244
See application file for complete search history.

(56) References Cited

U.S. PATENT DOCUMENTS

| 4,409,722 | A | | 10/1983 | Dockerty et al. | |
|---|---|---|---|---|---|
| 4,888,820 | A | * | 12/1989 | Chen et al. | 438/396 |
| 4,958,318 | A | * | 9/1990 | Harari | 365/149 |
| 5,013,680 | A | | 5/1991 | Lowrey et al. | |
| 5,028,990 | A | * | 7/1991 | Kotaki et al. | 257/306 |
| 5,108,941 | A | * | 4/1992 | Paterson et al. | 438/396 |
| 5,120,674 | A | * | 6/1992 | Chin et al. | 438/396 |

(Continued)

*Primary Examiner*—Thao X. Le
(74) *Attorney, Agent, or Firm*—Dinsmore & Shohl LLP (57) ABSTRACT

A semiconductor device and its method of fabrication are provided. The semiconductor device includes a substrate, a patterning stop region, an insulating overlayer, a container region within the insulating overlayer, a charge storage lamina or conductive layer over an interior surface of the container region; a contact region defined by the charge storage lamina or conductive layer; and an electrical contact in the contact region, wherein respective portions of the electrical contact and the charge storage lamina or conductive layer occupy collectively substantially all of the container region. A bit line terminal is coupled to the charge storage lamina through a switching structure. According to one embodiment of the present invention, a central patterning stop region and a pair of lateral patterning stop regions are provided such that the container region defines a container cross section having an upper container portion and a lower container portion, wherein the lower container portion is positioned between the lateral stop regions, and wherein the upper container portion is wider than the lower container portion.

5 Claims, 9 Drawing Sheets

U.S. PATENT DOCUMENTS

| | | |
|---|---|---|
| 5,262,343 A | 11/1993 | Rhodes et al. |
| 5,262,662 A * | 11/1993 | Gonzalez et al. ............ 257/307 |
| 5,292,677 A * | 3/1994 | Dennison .................... 438/396 |
| 5,317,193 A | 5/1994 | Watanabe |
| 5,327,375 A * | 7/1994 | Harari ........................ 365/149 |
| 5,369,048 A * | 11/1994 | Hsue .......................... 438/396 |
| 5,399,890 A | 3/1995 | Okada et al. |
| 5,425,392 A | 6/1995 | Thakur et al. |
| 5,439,835 A * | 8/1995 | Gonzalez .................... 438/241 |
| 5,466,629 A | 11/1995 | Mihara et al. |
| 5,488,011 A * | 1/1996 | Figura et al. ................ 438/253 |
| 5,492,853 A | 2/1996 | Jeng et al. |
| 5,494,841 A * | 2/1996 | Dennison et al. ........... 438/210 |
| 5,496,773 A | 3/1996 | Rhodes et al. |
| 5,521,408 A * | 5/1996 | Rha et al. ................... 257/309 |
| 5,529,944 A | 6/1996 | Rajeevakumar |
| 5,576,240 A * | 11/1996 | Radosevich et al. ........ 438/396 |
| 5,580,813 A | 12/1996 | Hachisuka et al. |
| 5,585,301 A | 12/1996 | Lee et al. |
| 5,604,659 A * | 2/1997 | Madan ........................ 361/303 |
| 5,607,878 A | 3/1997 | Otsuka et al. |
| 5,607,879 A | 3/1997 | Wuu et al. |
| 5,607,881 A | 3/1997 | Huang |
| 5,634,974 A | 6/1997 | Weimer et al. |
| 5,666,306 A | 9/1997 | Forbes |
| 5,686,337 A | 11/1997 | Koh |
| 5,716,881 A * | 2/1998 | Liang et al. ................. 438/238 |
| 5,723,889 A * | 3/1998 | Choi et al. ................... 257/329 |
| 5,739,068 A * | 4/1998 | Jost et al. .................... 438/637 |
| 5,760,434 A * | 6/1998 | Zahurak et al. .............. 257/309 |
| 5,760,474 A * | 6/1998 | Schuele ....................... 257/754 |
| 5,783,462 A * | 7/1998 | Huang .......................... 438/17 |
| 5,796,135 A * | 8/1998 | Liang et al. ................. 257/296 |
| 5,869,860 A * | 2/1999 | Widmann et al. ........... 257/304 |
| 5,914,512 A * | 6/1999 | Huang ......................... 257/306 |
| 6,059,692 A | 5/2000 | Hickman |
| 6,107,138 A | 8/2000 | Jeong et al. |
| RE37,505 E * | 1/2002 | Blalock et al. .............. 257/309 |

\* cited by examiner

SEMICONDUCTOR DEVICE INCORPORATING AN ELECTRICAL CONTACT TO AN INTERNAL CONDUCTIVE LAYER AND METHOD FOR MAKING THE SAME

CROSS REFERENCE TO RELATED APPLICATIONS

This application is a continuation of U.S. patent application Ser. No. 09/971,242, filed Oct. 4, 2001 now U.S. Pat. No. 6,410,380, which is a continuation of U.S. patent application Ser. No. 09/565,900 filed May 5, 2000 now abandoned, which is a division of related U.S. patent application Ser. No. 09/317,703 filed May 24, 1999 now abandoned, which is a division of U.S. patent application Ser. No. 08/881,737, now U.S. Pat. No. 5,970,340.

BACKGROUND OF THE INVENTION

The present invention relates to the field of semiconductor manufacture and, more particularly, to a semiconductor device, e.g., a dynamic random access memory, incorporating an external electrical contact to a conductive layer, e.g., a cell plate of a capacitive storage cell, formed in the interior of the semiconductor device.

A dynamic random access memory (DRAM) chip is an example of a semiconductor device where reliable electrical contacts to an internal conductive layer must be provided. A DRAM chip is a rectangular array of individual circuits organized to store binary information through storage of different levels of voltage in a capacitive charge storage region of the DRAM chip. A transistor structure, including a plurality of transistors, is provided in the DRAM chip to provide access to the charge stored in each charge storage region. Each transistor functions as an on-off switch to open the communication lines between the charge storage region and a microprocessor in communication with the DRAM chip.

A network of electrically conductive cell plate contacts must be provided within the structure of the DRAM chip to enable storage of non-zero voltage levels in each charge storage region. Reliable storage is directly dependent upon the integrity of the cell plate contact. Accordingly, it is necessary to provide cell or top plate contacts characterized by low contact resistance.

Accordingly, there is a continuing need for semiconductor devices incorporating reliable electrical contacts to internal conductive layers.

SUMMARY OF THE INVENTION

This need is met by the present invention wherein a semiconductor device, e.g., a dynamic random access memory, is provided incorporating a reliable electrical contact to a conductive layer within the semiconductor device, e.g., a cell or top plate of a capacitive storage cell.

In accordance with one embodiment of the present invention, a method of fabricating a storage container structure is provided comprising the steps of: providing a substrate including a semiconductor structure; forming a patterning stop region; forming an insulating overlayer over a first surface of the substrate and over the patterning stop region; patterning a container region within the insulating overlayer such that the container region defines a container cross section having container side walls, a container bottom wall, and a container interior bounded in part by the container side walls and the container bottom wall, and such that the container bottom wall is at least partially defined by a surface of the patterning stop region; layering a first conductive film over an interior surface of the container region; layering an intermediate insulating film over the first conductive film; layering a second conductive film over the intermediate insulating film such that the second conductive film includes a first film portion characterized by a first film thickness and a second film portion characterized by a second film thickness, such that the second film thickness is greater than the first film thickness, and such that the second film portion occupies at least a portion of the container interior; patterning a contact region in the second film portion of the second conductive film; and forming an electrical contact in the contact region such that respective portions of the electrical contact, the second conductive film, the intermediate insulating film, and the first conductive film occupy collectively at least a portion of the container region.

The respective portions of the electrical contact, the second conductive film, the intermediate insulating film, and the first conductive film preferably occupy collectively substantially all of the container region. The patterning stop region may be formed over the first surface of the substrate, within the substrate, or on the substrate. The container region is preferably patterned such that it further defines an upper boundary of the container cross section and the second conductive film is preferably layered such that the second film portion extends from the intermediate insulating film to at least the upper boundary of the container region. The contact region is preferably patterned, and the electrical contact is formed, such that the contact region and the electrical contact extend into the container region beyond the second film portion of the second conductive film.

In accordance with another embodiment of the present invention, a method of fabricating a storage container structure is provided comprising the steps of: providing a substrate including a semiconductor structure; forming a patterning stop region; forming an insulating overlayer over a first surface of the substrate and over the patterning stop region; patterning a container region within the insulating overlayer by removing a portion of an upper overlayer surface, a portion of an intermediate overlayer portion, and a portion of a lower overlayer surface such that (i) the container region defines a container cross section having container side walls, a container bottom wall, an upper container boundary, and a container interior bounded by the upper container boundary, the container side walls, and the container bottom wall, (ii) the upper container boundary is defined by the removed portion of the upper overlayer surface, (iii) the container side walls are defined by the insulating overlayer, and (iv) the container bottom wall is at least partially defined by a surface of the patterning stop region; layering a first conductive film over an interior surface of the container region; layering an intermediate insulating film over the first conductive film; layering a second conductive film over the intermediate insulating film such that the second conductive film includes a first film portion characterized by a first film thickness and a second film portion characterized by a second film thickness, such that the second film thickness is greater than the first film thickness, and such that the second film portion occupies at least a portion of the container interior; patterning a contact region in the second film portion of the second conductive film such that the contact region extends into the container region; and forming an electrical contact in the contact region such that respective portions of the electrical contact, the second conductive film, the intermediate insulating film, and the first conductive film occupy collectively at least a portion of the container region. The respective portions of the electrical contact, the second conductive film, the intermediate insulating film, and the first conductive film preferably occupy collectively substantially all of the container region.

In accordance with yet another embodiment of the present invention, a method of fabricating a storage container structure is provided comprising the steps of: providing a substrate including a semiconductor structure; forming a patterning stop region such that the patterning stop region includes a central stop region, a first lateral stop region, and a second lateral stop region; forming an insulating overlayer over a first surface of the substrate and over the patterning stop region; patterning a container region within the insulating overlayer such that the container region defines a container cross section having a container bottom wall, a first side wall including a first upper side wall portion and a first lower side wall portion, and a second side wall including a second upper side wall portion and a second lower side wall portion, and such that (i) the first upper side wall portion and the second upper side wall portion define an upper container portion therebetween, (ii) the first lower side wall portion and the second lower side wall portion define a lower container portion therebetween, (iii) the upper container portion is wider than the lower container portion, (iv) the container bottom wall is defined by the central stop region, (v) the first lower side wall portion is defined by a lateral surface of the first lateral stop region, and (vi) the second lower side wall portion is defined by an opposite lateral surface of the second lateral stop region; layering a first conductive film over an interior surface of the container region; layering an intermediate insulating film over the first conductive film; layering a second conductive film over the intermediate insulating film such that the second conductive film occupies at least a portion of an upper side wall region positioned between the first and second upper side wall portions; patterning a contact region in the second conductive film; and forming an electrical contact in the contact region such that respective portions of the electrical contact, the second conductive film, the intermediate insulating film, and the first conductive film occupy collectively at least a portion of the container region.

Respective portions of the electrical contact, the second conductive film, the intermediate insulating film, and the first conductive film preferably occupy collectively substantially all of the container region. The central stop region may be formed within the substrate and the first and second lateral stop regions may be formed over the first surface of the substrate.

In accordance with yet another embodiment of the present invention, a method of fabricating a storage container structure is provided comprising the steps of: providing a substrate including a semiconductor structure; forming a central patterning stop region; forming a pair of lateral patterning stop regions over a first surface of the substrate such that the lateral patterning stop regions form a substrate topography, the substrate topography including a central void positioned between the lateral patterning stop regions and over the central patterning stop region; forming an insulating overlayer over the first surface of the substrate and over the central and lateral patterning stop regions; patterning a container region within the insulating overlayer such that the container region defines a container cross section having an upper container portion and a lower container portion, such that the lower container portion is positioned within the central void, and such that the upper container portion is wider than the lower container portion; layering a first conductive film over an interior surface of the container region; layering an intermediate insulating film over an interior surface of the container region to define a back fill region such that the back fill region is bounded in part by an interior surface of the intermediate insulating film and such that the back fill region is positioned within the upper container portion; layering a second conductive film over the intermediate insulating film such that the second conductive film occupies at least a portion of the back fill region; patterning a contact region in the second conductive film such that the contact region occupies at least a portion of the upper container portion; and forming an electrical contact in the contact region such that respective portions of the electrical contact, the second conductive film, the intermediate insulating film, and the first conductive film occupy collectively at least a portion of the container region.

In accordance with yet another embodiment of the present invention, a method of fabricating a storage container structure is provided comprising the steps of: providing a silicon semiconductor substrate; forming a central patterning stop region within the substrate such that the central patterning stop region comprises a diffusion layer within the substrate; forming a first lateral patterning stop region over the substrate such that the first lateral patterning stop region comprises a nitride formed over a first portion of doped polysilicon; forming a second lateral patterning stop region over the substrate such that the second lateral patterning stop region comprises a nitride formed over a second portion of doped polysilicon, such that a central void is defined between the first lateral patterning stop region and the second lateral patterning stop region, and such that the central void is positioned over the central patterning stop region; forming an insulating glass overlayer over a first surface of the substrate and over the patterning stop region; selectively etching a container region within the insulating glass overlayer such that the container region defines a container cross section having a container bottom wall, a first side wall including a first upper side wall portion and a first lower side wall portion, and a second side wall including a second upper side wall portion and a second lower side wall portion, and such that (i) the first upper side wall portion and the second upper side wall portion define an upper container portion therebetween, (ii) the first lower side wall portion and the second lower side wall portion define a lower container portion therebetween, (iii) the upper container portion is wider than the lower container portion, (iv) the container bottom wall is defined by the central patterning stop region, (v) the first lower side wall portion is defined by a lateral surface of the first lateral patterning stop region, and (vi) the second lower side wall portion is defined by an opposite lateral surface of the second lateral patterning stop region; layering a first conductive polysilicon film over an interior surface of the container region; layering a dielectric hemispherical grain polysilicon film over the first conductive polysilicon film; layering a second conductive polysilicon film over the dielectric film such that the second conductive film occupies a lower side wall region positioned between the first and second lower side wall portions and at least a portion of an upper side wall region positioned between the first and second upper side wall portions; patterning a contact region in the second conductive film such that the contact region occupies at least a portion of the upper side wall region; and forming an electrical contact in the contact region such that the electrical contact extends along a substantially linear path from the lower side wall region through the upper side wall region to an exposed contact position above the container region, and such that respective portions of the electrical contact, the second conductive film, the dielectric hemispherical grain polysilicon film, and the first conductive film occupy collectively at least a portion of the container region.

In accordance with yet another embodiment of the present invention, a storage container structure is provided comprising: a substrate including a semiconductor structure; a patterning stop region; an insulating overlayer over a first surface of the substrate; a container region within the insulating overlayer, the container region defining a container cross section having container side walls, a container bottom wall, and a container interior bounded in part by the container side walls and the container bottom wall, wherein the container bottom wall is at least partially defined by a surface of the patterning stop region; a charge storage lamina over an interior surface of the container region; a contact region defined by the charge storage lamina, wherein the contact region defines a contact region cross section having contact region side walls and a contact region bottom wall, and wherein the contact region side walls and the contact region bottom wall are defined by a first surface of the charge storage lamina; and an electrical contact in the contact region, wherein respective portions of the electrical contact and the charge storage lamina occupy collectively at least a portion of the container region.

In accordance with yet another embodiment of the present invention, a storage container structure is provided comprising: a substrate including a semiconductor structure; a patterning stop region; an insulating overlayer over a first surface of the substrate, the insulating overlayer comprising a lower overlayer surface in contact with the substrate and the patterning stop region, an upper overlayer surface, and an intermediate overlayer portion defined between the lower overlayer surface and the upper overlayer surface; a container region within the insulating overlayer, the container region defining a container cross section having container side walls, a container bottom wall, an upper container boundary, and a container interior bounded by the container side walls, the container bottom wall, and the upper container boundary, wherein (i) the upper container boundary is continuous with the upper overlayer surface, (ii) the container side walls are defined by the insulating overlayer, and (iii) the container bottom wall is at least partially defined by a surface of the patterning stop region; a charge storage lamina over an interior surface of the container region; a contact region defined by the charge storage lamina, wherein the contact region defines a contact region cross section having contact region side walls and a contact region bottom wall, wherein the contact region side walls and the contact region bottom wall are defined by a first surface of the charge storage lamina, and wherein the contact region occupies at least a portion of the container region; and an electrical contact in the contact region, wherein respective portions of the electrical contact and the charge storage lamina occupy collectively at least a portion of the container region.

In accordance with yet another embodiment of the present invention, a storage container structure is provided comprising: a substrate including a semiconductor structure; a patterning stop region, wherein the patterning stop region includes a central stop region, a first lateral stop region, and a second lateral stop region; an insulating overlayer over a first surface of the substrate; a container region within the insulating overlayer, wherein the container region defines a container cross section having a container bottom wall, a first side wall including a first upper side wall portion and a first lower side wall portion, and a second side wall including a second upper side wall portion and a second lower side wall portion, wherein (i) the first upper side wall portion and the second upper side wall portion define an upper container portion therebetween, (ii) the first lower side wall portion and the second lower side wall portion define a lower container portion therebetween, (iii) the upper container portion is wider than the lower container portion, (iv) the container bottom wall is defined by the central stop region, (v) the first lower side wall portion is defined by a lateral surface of the first lateral stop region, and (vi) the second lower side wall portion is defined by an opposite lateral surface of the second lateral stop region; a charge storage lamina over an interior surface of the container region; a contact region defined by the charge storage lamina; and an electrical contact in the contact region, wherein respective portions of the electrical contact and the charge storage lamina occupy collectively at least a portion of the container region.

The respective portions of the electrical contact, the second conductive film, the intermediate insulating film, and the first conductive film preferably occupy collectively substantially all of the container region. The central stop region is preferably formed within the substrate and the first and second lateral stop regions are formed over the first surface of the substrate.

In accordance with yet another embodiment of the present invention, a storage container structure is provided comprising: a substrate including a semiconductor structure; a central patterning stop region; a pair of lateral patterning stop regions over a first surface of the substrate wherein a substrate topography defined by the pair of lateral patterning stop regions includes a central void positioned between the lateral patterning stop regions and over the central patterning stop region; an insulating overlayer over the first surface of the substrate; a container region within the insulating overlayer, wherein the container region defines a container cross section having an upper container portion and a lower container portion, wherein the lower container portion is positioned within the central void, and wherein the upper container portion is wider than the lower container portion; a charge storage lamina over an interior surface of the container region; a contact region defined by the charge storage lamina wherein the contact region occupies at least a portion of the upper container portion; and an electrical contact in the contact region, wherein respective portions of the electrical contact and the charge storage lamina occupy collectively at least a portion of the container region.

In accordance with yet another embodiment of the present invention, a storage container structure is provided comprising: a silicon semiconductor substrate; a central patterning stop region within a first surface of the substrate, wherein the central patterning stop region comprises a diffusion layer within the substrate; a first lateral patterning stop region over the substrate, wherein the first lateral patterning stop region comprises a nitride over a first portion of doped polysilicon; a second lateral patterning stop region over the substrate, wherein the second lateral patterning stop region comprises a nitride over a second portion of doped polysilicon, wherein a central void is defined between the first lateral patterning stop region and the second lateral patterning stop region, and wherein the central void is positioned over the central patterning stop region; an insulating glass overlayer over the first surface of the substrate; a container region within the insulating glass overlayer, wherein the container region defines a container cross section having a container bottom wall, a first side wall including a first upper side wall portion and a first lower side wall portion, and a second side wall including a second upper side wall portion and a second lower side wall portion, and wherein (i) the first upper side wall portion and the second upper side wall portion define an upper container portion therebetween, (ii) the first lower side wall portion and the second lower side wall portion define a lower container portion therebetween, (iii) the upper container portion is wider than the lower container portion, (iv) the container bottom wall is defined by the central patterning stop region, (v) the first lower side wall portion is defined by a lateral surface of the first lateral patterning stop region, and (vi) the second lower side wall portion is defined by an opposite lateral surface of the second lateral patterning stop region; a first conductive polysilicon film over an interior surface of the container region; a dielectric hemispherical grain polysilicon film over the first conductive polysilicon film; a second conductive polysilicon film over the dielectric hemispherical grain polysilicon film, wherein the second conductive film occupies at least a portion of an upper side wall region positioned between the first and second upper side wall portions; a contact region in the second conductive film, wherein the contact region occupies at least a portion of the upper side wall region; and an electrical contact in the contact region, wherein the electrical contact extends along a substantially linear path from the lower side wall region through the upper side wall region to an exposed contact position above the container region, and wherein the electrical contact, the second conductive film, the dielectric hemispherical grain polysilicon film, and the first conductive film occupy collectively at least a portion of the container region.

In accordance with yet another embodiment of the present invention, a method of fabricating a semiconductor device is provided comprising the steps of: providing a substrate including a semiconductor structure; forming a patterning stop region; forming an insulating overlayer over a first surface of the substrate and over the patterning stop region, such that the insulating overlayer comprises a lower overlayer surface in contact with the substrate and the patterning stop region, an upper overlayer surface, and an intermediate overlayer portion defined between the lower overlayer surface and the upper overlayer surface; patterning a container region within the insulating overlayer by removing a portion of the upper overlayer surface, a portion of the intermediate overlayer portion, and a portion of the lower overlayer surface such that (i) the container region defines a container cross section having container side walls, a container bottom wall, an upper container boundary, and a container interior bounded by the upper container boundary, the container side walls, and the container bottom wall, (ii) the upper container boundary is defined by the removed portion of the upper overlayer surface, (iii) the container side walls are defined by the insulating overlayer, and (iv) the container bottom wall is at least partially defined by a surface of the patterning stop region; (v) layering a conductive film over an interior surface of the container region such that the conductive film includes a first film portion characterized by a first film thickness and a second film portion characterized by a second film thickness, such that the second film thickness is greater than the first film thickness, and such that the second film portion occupies at least a portion of the container interior; patterning a contact region in the second film portion of the conductive film such that the contact region extends into the container region; and forming an electrical contact in the contact region such that respective portions of the electrical contact and the conductive film occupy collectively at least a portion of the container region.

In accordance with yet another embodiment of the present invention, a method of fabricating a semiconductor device is provided comprising the steps of: providing a substrate including a semiconductor structure; forming a patterning stop region such that the patterning stop region includes a central stop region, a first lateral stop region, and a second lateral stop region; forming an insulating overlayer over a first surface of the substrate and over the patterning stop region; patterning a container region within the insulating overlayer such that the container region defines a container cross section having a container bottom wall, a first side wall including a first upper side wall portion and a first lower side wall portion, and a second side wall including a second upper side wall portion and a second lower side wall portion, and such that (i) the first upper side wall portion and the second upper side wall portion define an upper container portion therebetween, (ii) the first lower side wall portion and the second lower side wall portion define a lower container portion therebetween, (iii) the upper container portion is wider than the lower container portion, (iv) the container bottom wall is defined by the central stop region, (v) the first lower side wall portion is defined by a lateral surface of the first lateral stop region, and (vi) the second lower side wall portion is defined by an opposite lateral surface of the second lateral stop region; layering a conductive film over an interior surface of the container region such that the conductive film occupies at least a portion of an upper side wall region positioned between the first and second upper side wall portions; patterning a contact region in the conductive film; and forming an electrical contact in the contact region such that respective portions of the electrical contact and the conductive film occupy collectively at least a portion of the container region.

In accordance with yet another embodiment of the present invention, a semiconductor device is provided comprising: a substrate including a semiconductor structure; a patterning stop region, wherein the patterning stop region includes a central stop region, a first lateral stop region, and a second lateral stop region; an insulating overlayer over a first surface of the substrate; a container region within the insulating overlayer, wherein the container region defines a container cross section having a container bottom wall, a first side wall including a first upper side wall portion and a first lower side wall portion, and a second side wall including a second upper side wall portion and a second lower side wall portion, wherein (i) the first upper side wall portion and the second upper side wall portion define an upper container portion therebetween, (ii) the first lower side wall portion and the second lower side wall portion define a lower container portion therebetween, (iii) the upper container portion is wider than the lower container portion, (iv) the container bottom wall is defined by the central stop region, (v) the first lower side wall portion is defined by a lateral surface of the first lateral stop region, and (vi) the second lower side wall portion is defined by an opposite lateral surface of the second lateral stop region; a conductive layer over an interior surface of the container region; a contact region in the conductive film; and an electrical contact in the contact region, wherein respective portions of the electrical contact and the conductive film occupy collectively at least a portion of the container region.

In accordance with yet another embodiment of the present invention, a method of fabricating a memory device is provided comprising the steps of: forming a storage container structure according to any of the embodiments of the present invention described herein; and coupling a bit line terminal to a charge storage lamina through a switching structure such that the charge storage lamina comprises the first conductive film, the intermediate insulating film, and the second conductive film, and such that a charge transfer status of the switching structure changes in response to a memory access command.

In accordance with yet another embodiment of the present invention, a memory device is provided comprising: a storage container structure according to any of the embodiments of the present invention described herein; and a bit line terminal coupled to the charge storage lamina through a switching structure, wherein a charge transfer status of the switching structure changes in response to a memory access command.

In accordance with yet another embodiment of the present invention, a method of fabricating a computer system is provided comprising the steps of: forming a storage container structure according to any of the embodiments of the present invention described herein; coupling a bit line terminal to a charge storage lamina through a switching structure such that the charge storage lamina comprises the first conductive film, the intermediate insulating film, and the second conductive film, and such that a charge transfer status of the switching structure changes in response to a memory access command; and providing a microprocessor in communication with a plurality of the storage container structures via respective ones of a plurality of the bit line terminals.

In accordance with yet another embodiment of the present invention, a computer system is provided comprising: a storage container structure according to any of the embodiments of the present invention described herein; a bit line terminal coupled to the charge storage lamina through a switching structure, wherein a charge transfer status of the switching structure changes in response to a memory access command; and a microprocessor in communication with a plurality of the charge storage structures via respective ones of a plurality of the bit line terminals.

Accordingly, it is an object of the present invention to provide semiconductor devices incorporating reliable electrical contacts to internal conductive layers of the semiconductor device.

DETAILED DESCRIPTION OF THE INVENTION

A method of fabricating a storage container structure 8 according to the present invention, incorporating a reliable electrical contact to an internal conductive layer of the storage container structure 8, is illustrated in FIGS. 1A–1G. Initially, a substrate 10 including a semiconductor structure 12 is provided. The semiconductor structure 12 may comprise part or all of a silicon wafer forming the substrate 10. Alternatively, the substrate 10 may be a semiconductor, an insulator, or an appropriately insulated conductor and the semiconductor structure 12 may comprise any of a variety of other materials or assemblies operative to function as a semiconductor, e.g. a semiconductor layer formed on an insulating layer, a semiconductor region formed within an insulating layer, etc.

Figure 1A:
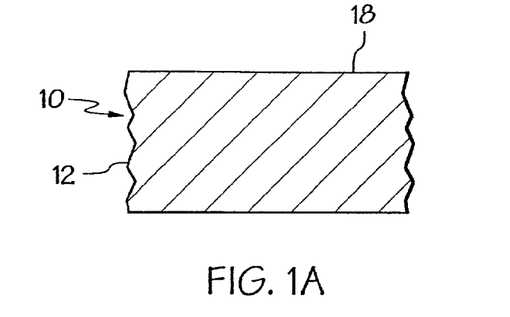
FIGS. 1A–1G are cross sectional views illustrating a storage container structure and its method of fabrication according to the present invention.
Figure 1B:
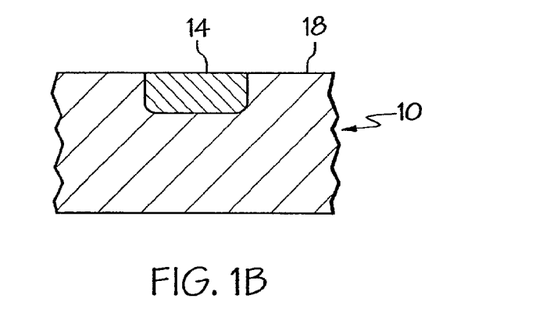

Referring now to FIG. 1B, a patterning stop region 14 is formed in the substrate 10. The patterning stop region 14 comprises a material selected to prevent electrical shorting between the contact 48 and the semiconductor structure 12. Typically, the patterning stop region 14 comprises a diffusion region or an active area within the substrate 10. However, it is contemplated that the patterning stop region 14 may also comprise a material formed over the substrate 10, i.e., on or above the substrate 10. It should be noted that, for the purposes of defining the present invention, "on a substrate" refers to formation in contact with a surface of the substrate, "over a substrate" refers to formation above or in contact with a surface of the substrate, and "within a substrate" refers to formation of part or all in the interior of the substrate.

Figure 1C:
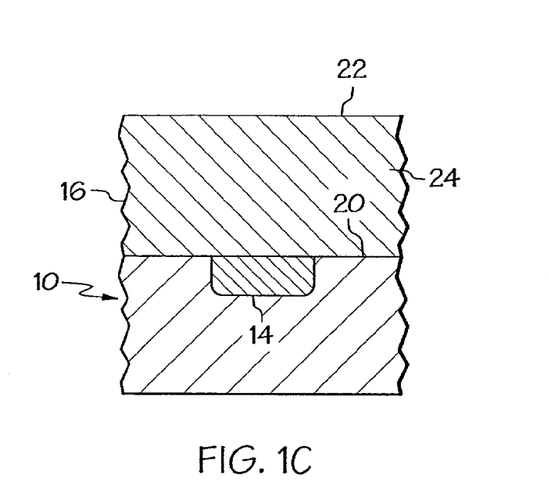

An insulating overlayer 16 is formed over a first surface 18 of the substrate 10 and over the patterning stop region 14 (see FIG. 1C). The insulating overlayer 16 is formed such that it comprises a lower overlayer surface 20 in contact with the substrate 10 and the patterning stop region 14, an upper overlayer surface 22, and an intermediate overlayer portion 24 defined between the lower overlayer surface 20 and the upper overlayer surface 22. The insulating overlayer 16 typically comprises a glass insulating layer, e.g., borophosphosilicate glass, but may comprise any electrically insulating layer which permits removal of portions thereof by etching, photo patterning, or another process.

Figure 1D:
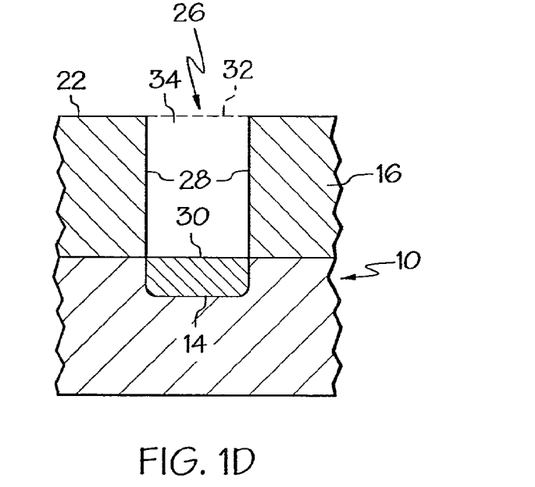

Referring now to FIG. 1D, a container region 26 is patterned, e.g., by etching, within the insulating overlayer 16 by removing a portion of the upper overlayer surface 22, a portion of the intermediate overlayer portion 24, and a portion of the lower overlayer surface 20. The container region 26 is patterned such that it defines a container cross section having container side walls 28, a container bottom wall 30, an upper container boundary 32, and a container interior 34 bounded by the upper container boundary 32, the container side walls 28, and the container bottom wall 30. It is contemplated by the present invention that the container region 26 is likely to extend into the patterning stop region 14 as a result of the patterning process.

For the purpose of defining the present invention, an object or area "bounded" by a boundary or a line extends as far as but not beyond the boundary or line. An object or area is bounded in part by a boundary or line when the boundary or line limits the extent of a portion of the object or area. It is contemplated by the present invention, that structure referred to herein as a wall may include surfaces other than vertical or horizontal surfaces, e.g., inclined surfaces or surfaces having a variety of curved or linear profiles. For the purpose of defining the present invention a portion of an object includes all or part of that object.

The upper container boundary 32 is defined by the removed portion of the upper overlayer surface 22 such that it is continuous with the upper overlayer surface 22. The container side walls 28 are defined by portions of the insulating overlayer 16 and the container bottom wall 30 is defined by a surface of the patterning stop region 14. For the purpose of defining the present invention, a wall, boundary, surface, etc., is defined by a corresponding wall, boundary, surface, etc., when at least a portion of the corresponding wall, boundary, surface, etc., forms the defined wall, boundary, surface, etc. It is contemplated by the present invention that the dimensions of the patterning stop region 14 need not precisely correspond to the dimensions of the container bottom wall 14. The container region 26, and other areas patterned according to the present invention, are typically patterned by an etching or photo patterning process. It is contemplated by the present invention that a variety of material removal processes could be used to pattern the container region 26, e.g., wet or dry etching, ion milling, reactive ion etching, etc.

Figure 1E:
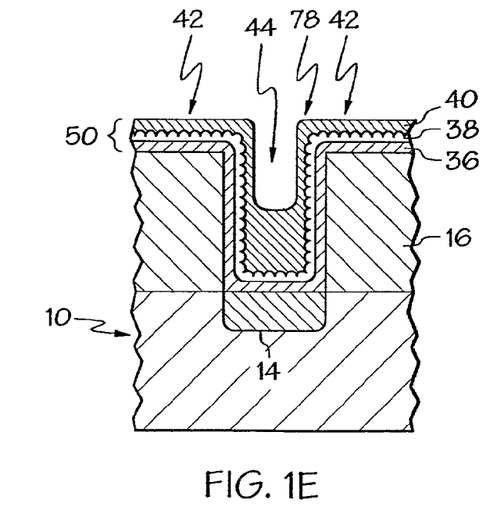

Referring now to FIG. 1E, a first conductive film 36 is layered over the interior surface of the container region 26 and over a portion of the upper overlayer surface 22. The interior surface is that surface of the container region 26 which is directly adjacent the container interior 34. Next, an intermediate insulating film 38 is layered over the first conductive film 36. Then, a second conductive film 40 is layered over the intermediate insulating film 38. In this manner, the components of a charge storage lamina 50 comprising the first conductive film 36, the intermediate insulating film 38, and the second conductive film 40 are provided. The first conductive film 36 and the second conductive film 40 may comprise any of a variety of conductive materials suitable for semiconductor device fabrication. For example, the conductive films 36, 40 may comprise conventional doped polysilicon films formed by sputtering, evaporation, or chemical vapor deposition. The intermediate insulating film 38 may comprise any of a variety of insulating materials operable as a dielectric material. For example, the intermediate insulating film 38 may comprise hemispherical grain polysilicon, as will be appreciated by one skilled in the art. For the purpose of defining the present invention an insulating layer or material includes layers or materials utilized in the art of semiconductor manufacture as insulating layers or dielectric layers. Similarly, a conductive layer or conductive material includes layers or materials utilized in the art of semiconductor manufacture as storage cell electrodes, connection electrodes, or other electrical connections associated with a semiconductor device.

The second conductive film 40 forms a back fill region 78 which is layered such that it includes a first film portion 42 characterized by a first film thickness and a second film portion 44 characterized by a second film thickness, and such that the second film thickness is greater than the first film thickness and the second film portion 44 occupies at least a portion of the container interior 34. The second conductive film 40 is layered such that the second film portion 44 extends from the intermediate insulating film 38 in the direction of the upper boundary 32 of the container region 26. The second film portion 44 occupies enough of the back fill region 78 to reduce the probability of etching into the substrate 10 during patterning of a contact region 46 in the second conductive film 40, as described below with reference to FIG. 1F. It is contemplated by the present invention that the second film thickness, which may extend up to and beyond the upper boundary 32 of the container region 26, is dependent upon the nature of the particular layering process, any subsequent patterning processes, and the particular preferences of those practicing the present invention.

Films are layered according to the present invention by growing or depositing material on a surface through any of a variety of layering processes, e.g., oxidation, chemical vapor deposition, evaporation, sputtering, etc. For the purpose of defining the present invention, a material which is said to occupy a space fills the space; however, a material which is said to occupy at least a portion of a space fills the space or merely fills a portion of the space. A material which is said to occupy a space may also exceed the bounds of that space.

Figure 1F:
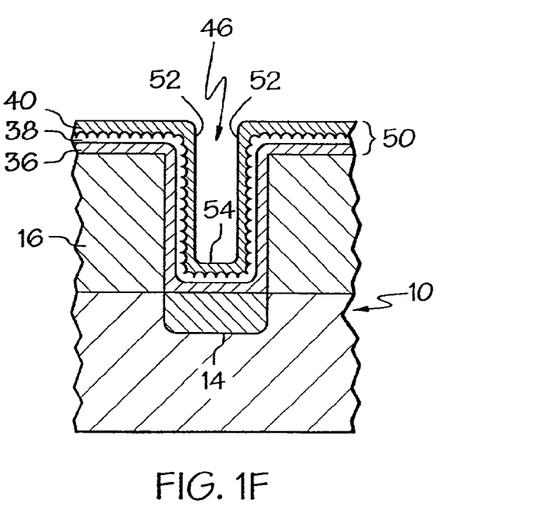
Figure 1G:
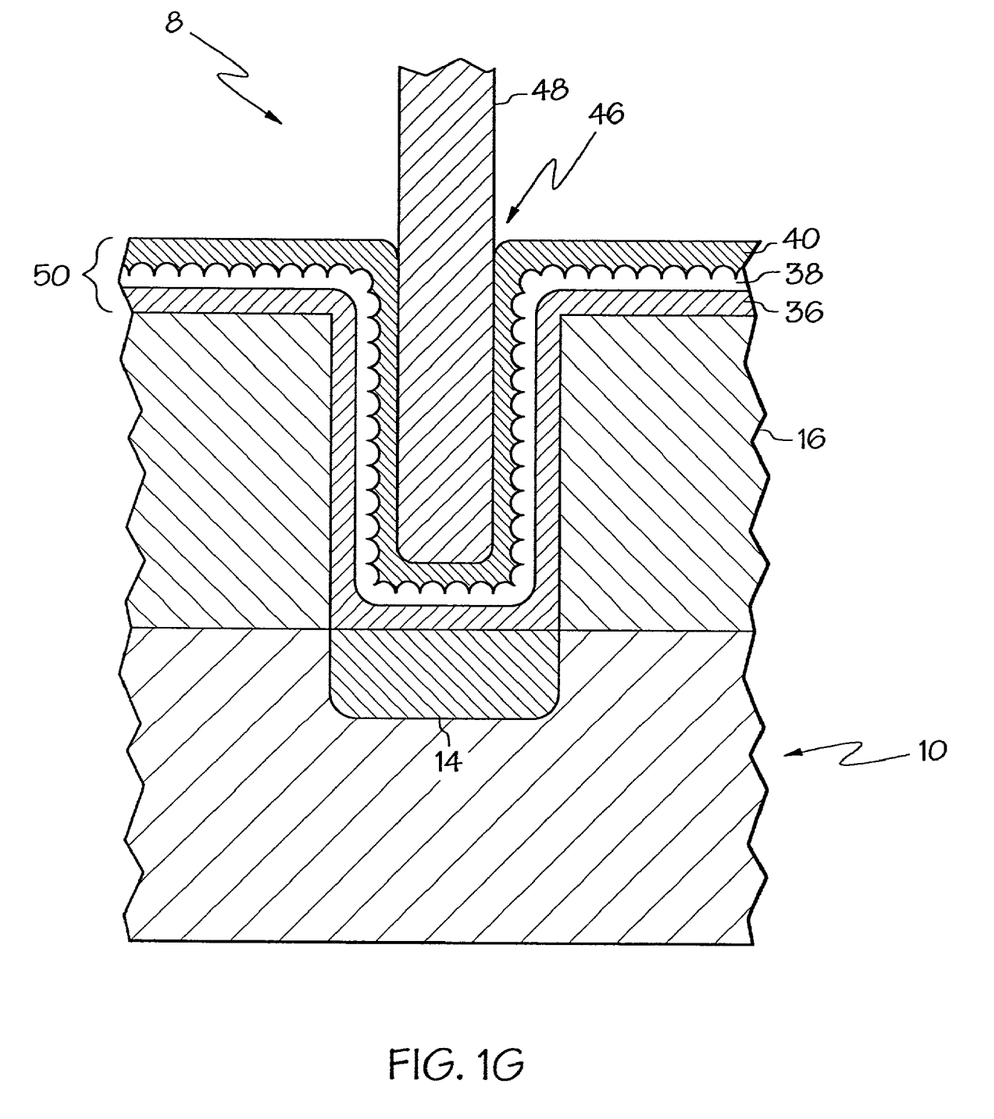

Referring now to FIG. 1F, a contact region 46 is patterned in the second film portion 44 of the second conductive film 40 such that the contact region 46 extends into the container region 26. An electrical contact 48, see FIG. 1G, is then formed in the contact region 46 such that respective portions of the electrical contact 48, the second conductive film 40, the intermediate insulating film 38, and the first conductive film 36 occupy collectively a significant portion of the container region 26, and may occupy collectively substantially all of the container region 26. The electrical contact is typically a refractory metal silicide, e.g. tungsten silicide, selectively deposited into the contact region 46. It is contemplated by the present invention that a variety of material removal processes could be used to pattern the contact region 46, e.g., wet or dry etching, ion milling, reactive ion etching, etc.

Accordingly, a storage container structure 8 according to the present invention is illustrated in FIG. 1G, where the thicknesses and widths of the various layers and regions are not necessarily illustrated in proper scale, except where indicated herein. The storage container structure comprises the charge storage lamina 50, the electrical contact 48, the patterning stop region 14, the substrate 10, and the insulating overlayer 16. It is contemplated by the present invention that the storage container structure 8 may include further components within or adjacent any of the layers illustrated in FIG. 1G. For example, as will be appreciated by those skilled in the art, an array of metal conductive layers for making electrical contact with respective electrical contacts 48 and a passivation layer forming an uppermost surface of the storage container structure 8 are typically provided to form a complete structure.

The charge storage lamina 50 illustrated in FIG. 1G includes the first conductive film 36, the intermediate insulating film 38, and the second conductive film 40 structured and arranged to function as a capacitor in a manner well documented in the art. However, it is contemplated by the present invention that any of a variety of alternative charge storage laminas may be used according to the present invention. The contact region 46 occupies at least a portion of the container region 26, see FIGS. 1D, 1F, and 1G.

A first surface of the charge storage lamina 50 defines the contact region side walls 52 and the contact region bottom wall 54 of the contact region 46, see FIG. 1F. The electrical contact 48 formed in the contact region 46 is characterized by a low contact resistance because of the extended contact surface area defined between the electrical contact 48 and the charge storage lamina 50.

Figure 2:
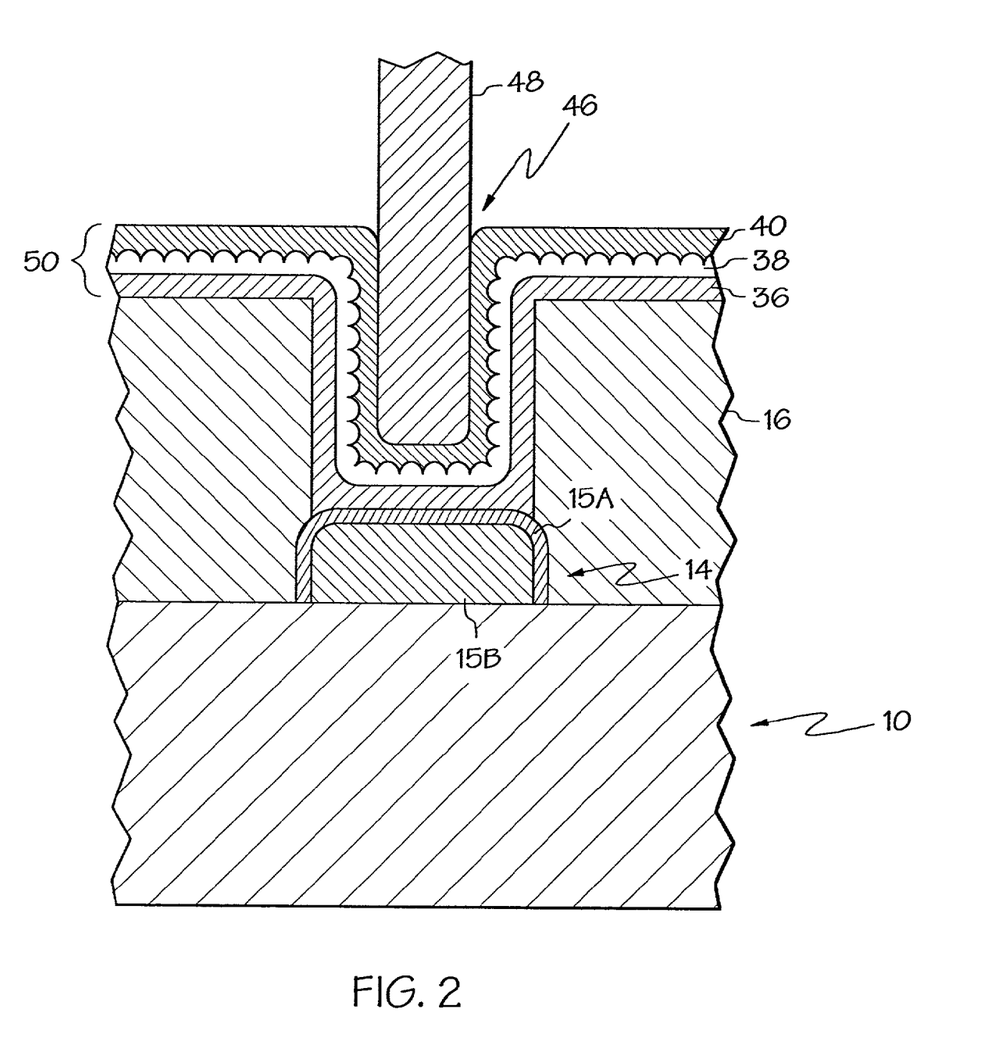
FIG. 2 is a cross sectional illustration of a storage container structure according to the present invention.

In the embodiment illustrated in FIG. 2, where like reference numerals refer to like elements, an alternative patterning stop region 14' comprises an etch selective material formed over the substrate 10. For example, the alternative patterning stop region 14' preferably comprises a silicon nitride layer 15A formed over a doped polysilicon topographic core 15B.

Referring now to FIGS. 3A–3H, a method of fabricating an alternative storage container structure 9 according to another embodiment of the present invention, incorporating a reliable electrical contact to an internal conductive layer of the alternative storage container structure 9, is illustrated. Initially, a substrate 10 including a semiconductor structure 12 is provided, see FIG. 3A. Subsequently, a patterning stop region including a central patterning stop region 52, a first lateral patterning stop region 54, and a second lateral patterning stop region 56, are provided, see FIGS. 3B and 3C. It is noted that for the purposes of describing the present invention, like structure is indicated with like reference numerals. A reference numeral followed by a prime indicates like structure incorporating variations in physical shape or dimension.

Figure 3A:
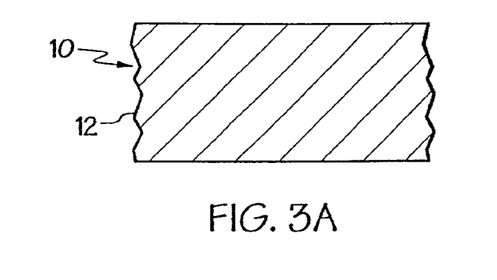
FIGS. 3A–3H are cross sectional views illustrating an alternative storage container structure and its method of fabrication according to the present invention.
Figure 3B:
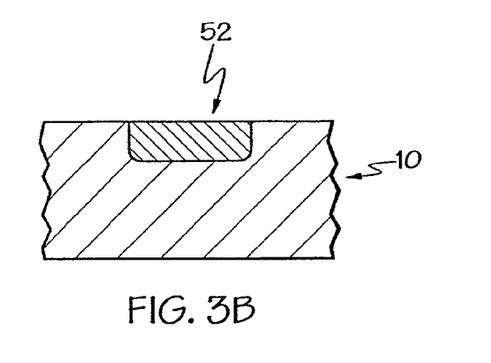
Figure 3C:
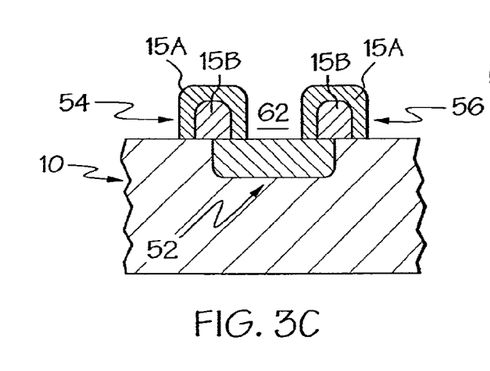
Figure 3D:
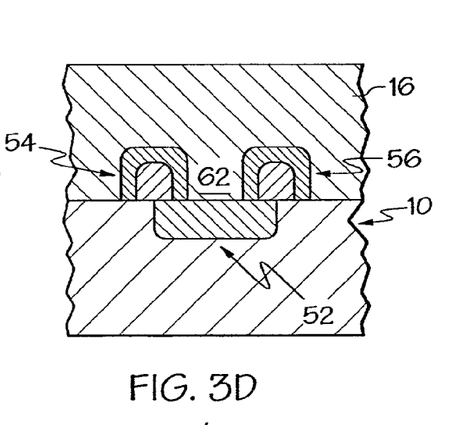

The central patterning stop region 52, see FIG. 3B, comprises an patterning stop region provided within the substrate 10. However, it is contemplated that the central patterning stop region 52 may also comprise a material formed over the substrate 10, i.e., on or above the substrate 10. Similarly, the first and second lateral patterning stop regions 54, 56, see FIG. 3C, are provided over the substrate 10 and typically comprise an etch selective material in the form of a silicon nitride layer 15A formed over a doped polysilicon topographic core 15B. However, the etch selective material may comprise any of a variety of materials which create a surface topography and which etch selectively with respect to surrounding structural materials.

The pair of lateral patterning stop regions 54, 56 form a substrate topography including a central void 62 positioned between the lateral patterning stop regions 54, 56 and over the central patterning stop region 52. An insulating overlayer 16 is formed over a first surface 18 of the substrate 10 and over the central and lateral patterning stop regions 52, 54, 56 (see FIG. 3D). The insulating overlayer 16 typically comprises a glass insulating layer, e.g., borophosphosilicate glass, but may comprise any electrically insulating layer which permits removal, by etching or otherwise, of portions thereof.

Figure 3E:
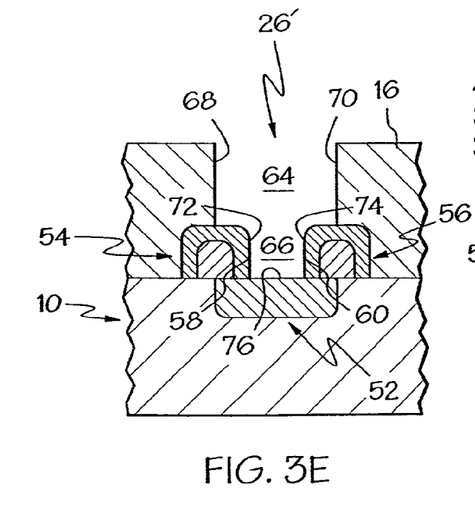

A container region 26' is patterned within the insulating overlayer 16 such that the container region 26' defines a container cross section having an upper container portion 64 and a lower container portion 66, see FIG. 3E. The lower container portion 66 is positioned within the central void 62 and the upper container portion 64 is wider than the lower container portion 66. A first upper side wall portion 68 and a second upper side wall portion 70 of the cross section define the upper container portion 64 therebetween. A first lower side wall portion 72 and a second lower side wall portion 74 of the cross section define the lower container portion 66 therebetween. The first lower side wall portion 72 is defined by a lateral surface 58 of the first lateral patterning stop region 54 and the second lower side wall portion 74 is defined by an opposite lateral surface 60 of the second lateral patterning stop region 56. The container bottom wall is defined by an upper surface 76 of the central patterning stop region 52. For the purpose of defining the present invention where the walls of the upper container portion 64 or the walls of the lower container portion 66 are inclined or otherwise non-vertical, the upper container portion 64 is said to be wider than the lower container portion 66 if its average width is larger than that of the lower container portion 66. It is contemplated by the present invention that the container region 26' may extend partially into an area formerly occupied by the central patterning stop region 52 as a result of the particular patterning process utilized to create the container region 26'. It is contemplated by the present invention that the first and second lateral patterning stop regions 54, 56 and the central patterning stop region 52 may include an additional layer of material positioned thereon such that the additional layer defines the container region 26'. For example, a relatively thin layer of unremoved insulating overlayer 16 may be positioned between any one or all of the patterning stop regions 52, 54, 56 and the container region 26'.

Figure 3F:
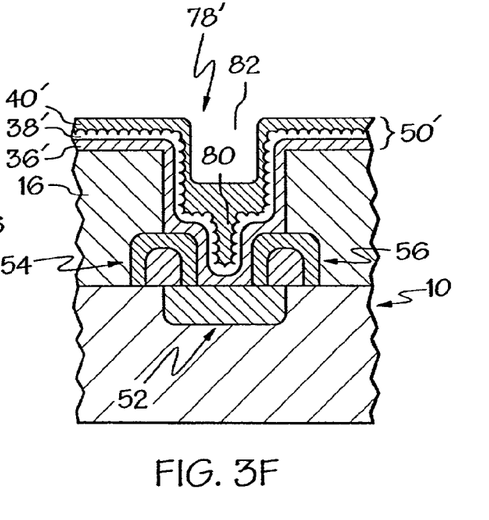

Referring now to FIGS. 3E and 3F, a first conductive film 36' is layered over an interior surface of the container region 26'. Next, an intermediate insulating film 38' is layered over the first conductive film 36' to define a back fill region 78'. The back fill region 78' is bounded by an interior surface of the intermediate insulating film 38' and is positioned within the upper container portion 64 and the lower container portion 66. A second conductive film 40' is layered over the intermediate insulating film 38' such that the second conductive film 40' occupies a lower side wall region 80 and at least a portion of an upper side wall region 82 of the back fill region 78'. The lower side wall region 80 is narrower than the upper side wall region 82. In this manner, the components of a charge storage lamina 50' comprising the first conductive film 36', the intermediate insulating film 38', and the second conductive film 40' are provided.

The extent to which the second conductive film 40' occupies the upper side wall region 82 may be controlled by controlling the spacing of the first and second lateral patterning stop regions 54, 56. The extent to which the second conductive film 40' occupies the upper side wall region 82 is also dependent upon the nature of the particular layering process, any subsequent patterning processes, and the particular preferences of those practicing the present invention. The second conductive film 40' occupies enough of the back fill region 78' to reduce the probability of etching into the substrate 10 during patterning of a contact region 46' in the second conductive film 40, as described below with reference to FIG. 3G.

Figure 3G:
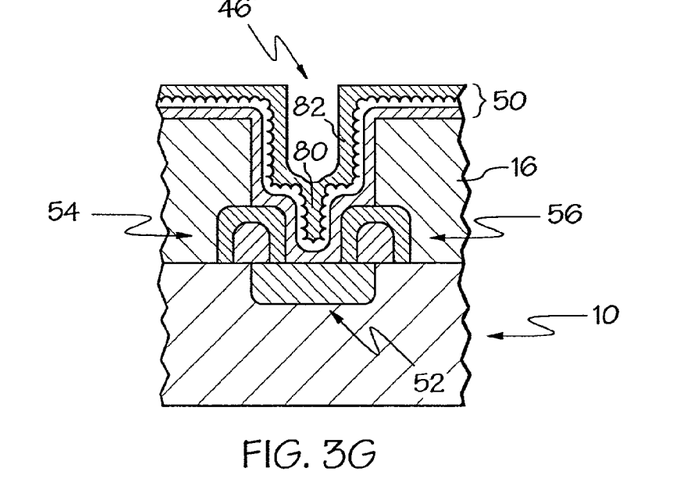

As shown in FIG. 3G, a contact region 46' is patterned in the second conductive film 40' such that the contact region 46' occupies at least a portion of the upper side wall region 82 and the upper container portion 64 and may extend into the lower side wall region 80 and the lower container portion 66.

Figure 3H:
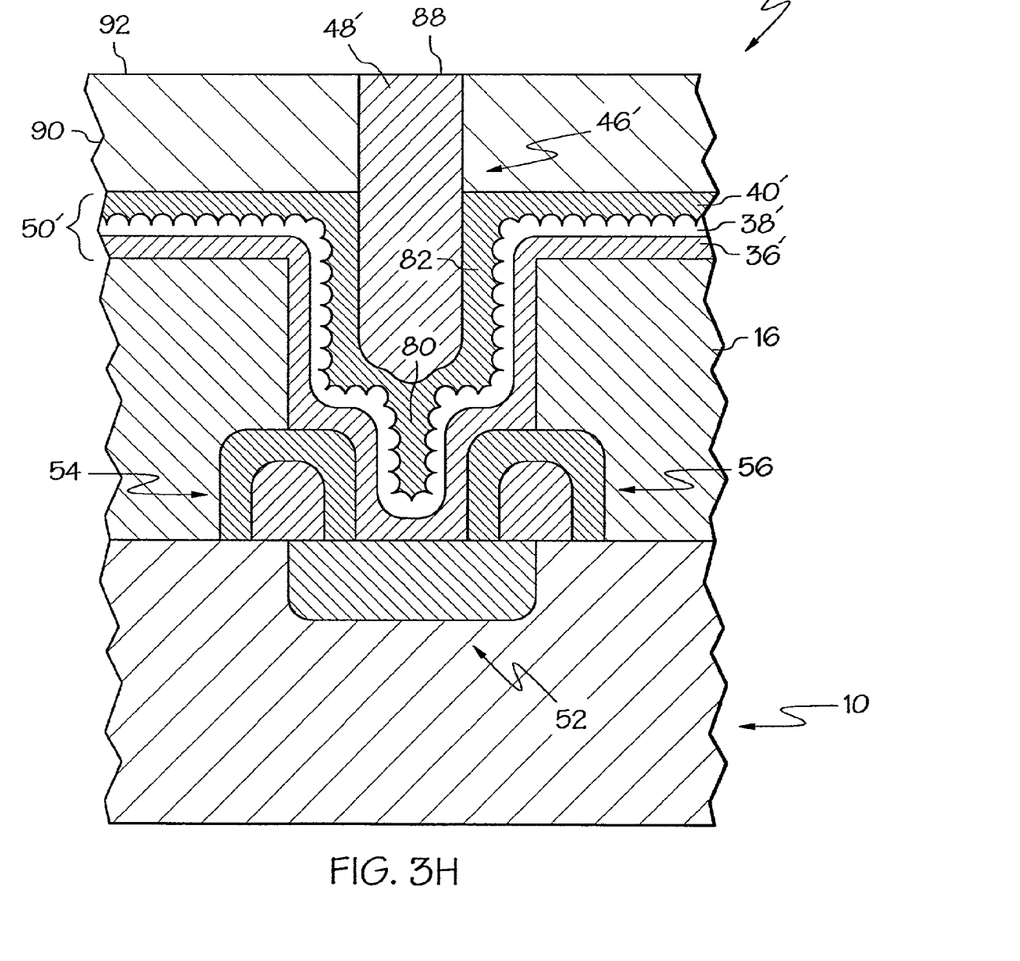

An electrical contact 48' is formed in the contact region 46' to extend, preferably along a substantially linear path, from the lower side wall region 80 through the upper side wall region 82 to an exposed contact position 88 above the container region 26', see FIG. 3H. Respective portions of the electrical contact 48', the second conductive film 40', the intermediate insulating film 38', and the first conductive film 36' occupy a significant portion of the container region 26', see FIGS. 3E and 3H, and may occupy collectively substantially all of the container region 26'. For the purpose of defining the present invention, a surface or region is said to be exposed when the surface or region is not covered by another solid material.

Accordingly, an alternative storage container structure 9 according to the present invention is illustrated in FIG. 3H. The alternative storage container structure 9 comprises a charge storage lamina 50', the electrical contact 48', the pair of lateral patterning stop regions 54, 56, the central patterning stop region 52, the substrate 10, and the insulating overlayer 16. The contact region 46' is defined by the charge storage lamina 50'. It is contemplated by the present invention that the storage container structure 9 may include further components within or adjacent any of the layers illustrated in FIG. 3H.

The electrical contact 48' formed in the contact region 46' is characterized by a low contact resistance because of the extended contact surface area defined between the electrical contact 48' and the charge storage lamina 50'. The reduced width of the lower side wall region 80 ensures that, during production of a plurality of storage container structures 9 according to the method of the present invention, the second conductive film 40' will reliably and consistently occupy respective lower side wall regions 80 and upper side wall regions 82 of each storage container structure 9 so produced. It is contemplated by the present invention that the spacing of the lateral patterning stop regions 54, 56, which, for example, is controlled by the respective widths of the regions 54, 56, is selected such that reliable filling of the back fill region 78' is achieved, see FIG. 3F. As will be appreciated by those skilled in the art, the spacing may be varied according to the specific mode of manufacture utilized to practice the present invention and according to the specific device tolerances required for a particular application.

Figure 4:
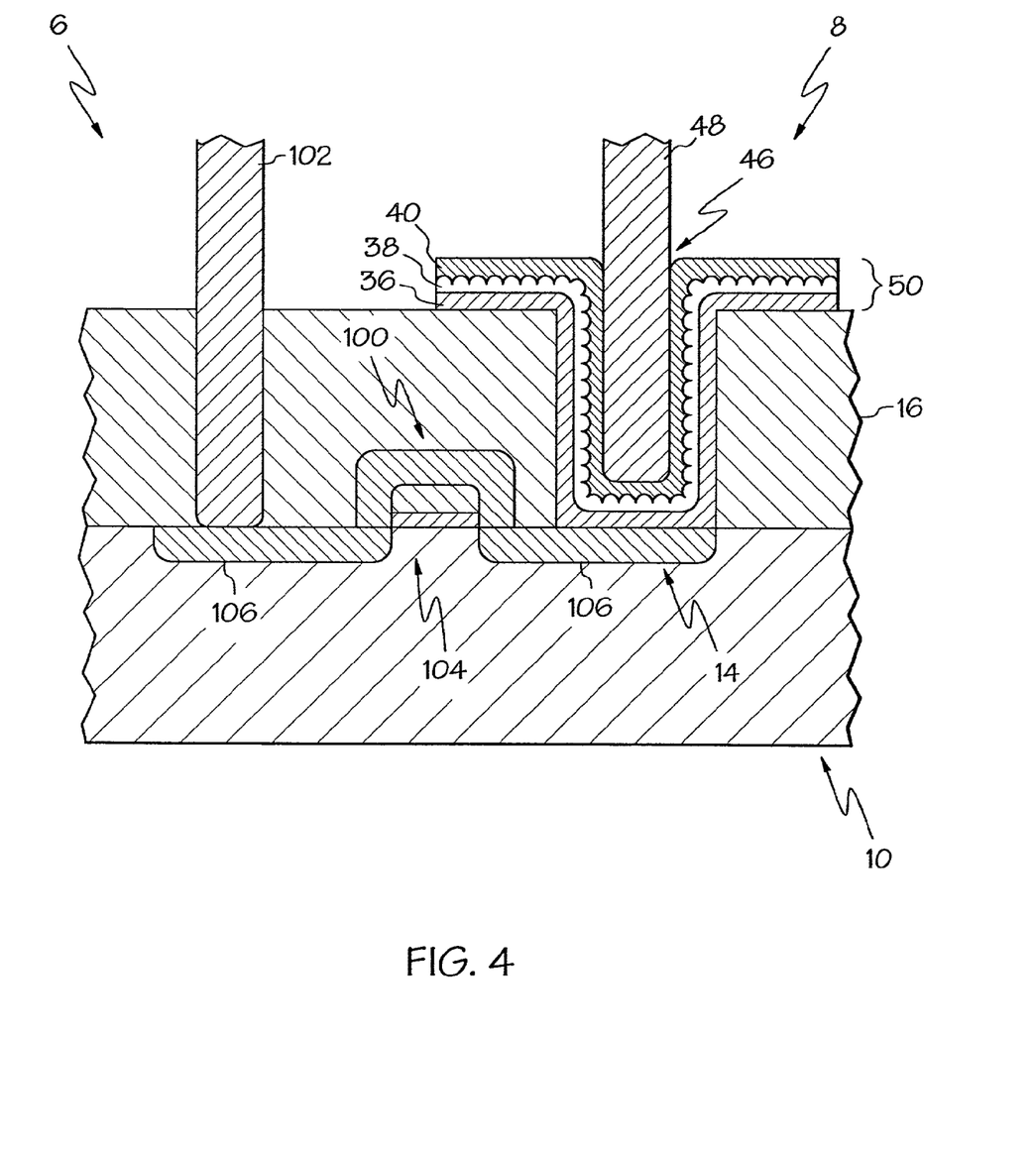
FIG. 4 is a cross sectional illustration of a memory device and its method of fabrication according to the present invention.

Referring now to FIG. 4, a memory device 6 and its method of fabrication according to the present invention are illustrated. The memory device 6 incorporates the storage container structure 8 described herein with reference to FIGS. 1A–1G. Accordingly, the storage container structure 8 portion of the memory device 6 is fabricated substantially as described herein with reference to FIGS. 1A–1G. The remainder of the memory device 6 is assembled by providing a conventional switching structure 100, in any of a number of well known manners, and by coupling a bit line terminal 102 to the charge storage lamina 50 through the switching structure 100. The charge storage lamina 50 comprises the first conductive film 36, the intermediate insulating film 38, and the second conductive film 40. The charge transfer status of the switching structure 100 changes in response to a memory access command to enable transfer of charge stored in the charge storage lamina 50 to the bit line terminal 102. As will be appreciated by those skilled in the art, the switching structure 100 preferably comprises a field effect transistor including a gate 104 and a pair of doped source/drain regions 106.

Figure 5:
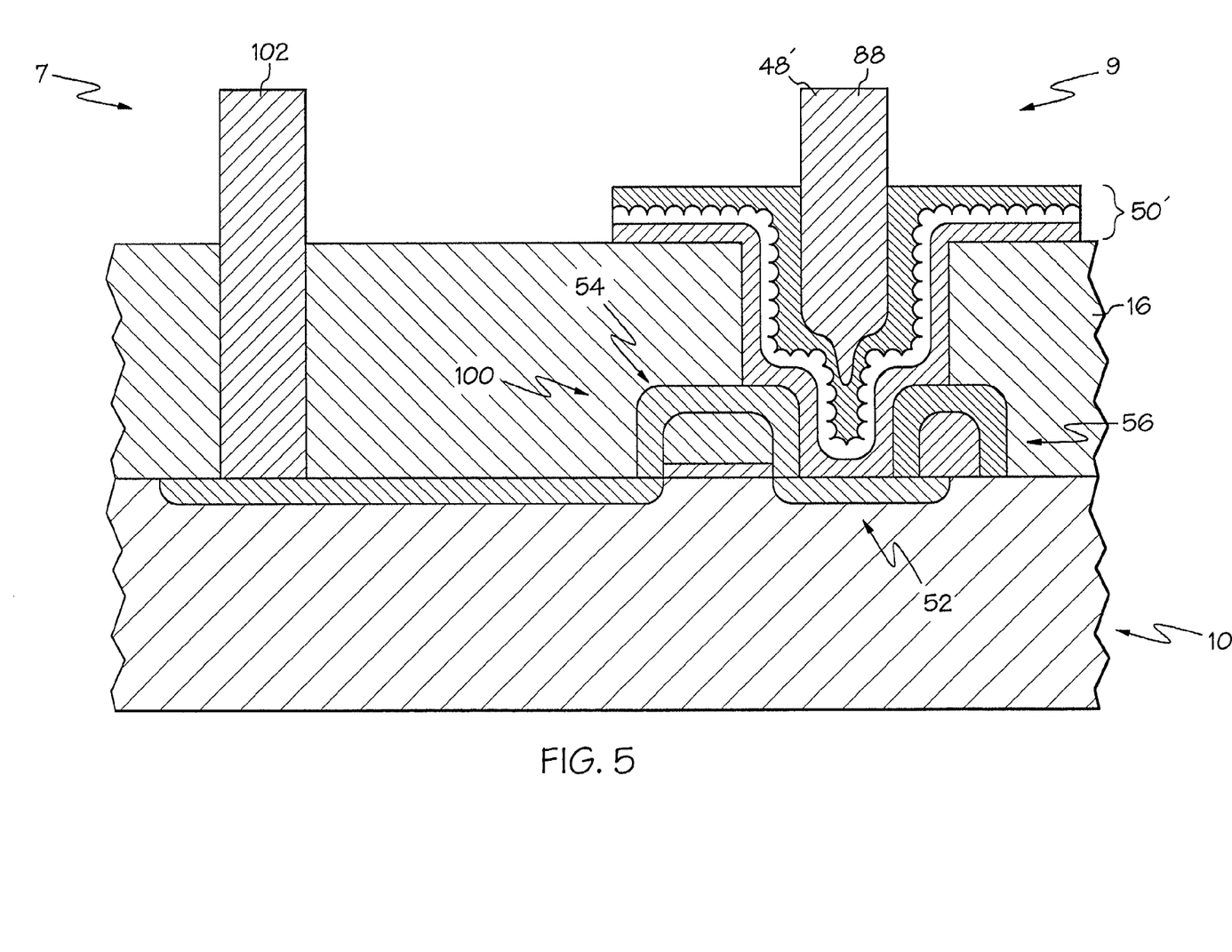
FIG. 5 is a cross sectional illustration of an alternative memory device and its method of fabrication according to the present invention.

Referring now to FIG. 5, an alternative memory device 7 and its method of fabrication according to the present invention are illustrated. The memory device 7 incorporates the alternative storage container structure 9 described herein with reference to FIGS. 3A–3H. Accordingly, the alternative storage container structure 9 portion of the memory device 6 is fabricated substantially as described herein with reference to FIGS. 1A–1G, with the exception that the first lateral patterning stop region 54 embodies the switching structure 100 described above with reference to FIG. 4. The remainder of the memory device 7 is assembled by providing the bit line terminal 102, as described above with respect to FIG. 4. As noted above, the bit line terminal 102 is coupled to the charge storage lamina 50' through the switching structure 100. The charge transfer status of the switching structure 100 changes in response to a memory access command to enable transfer of charge stored in the charge storage lamina 50' to the bit line terminal 102.

Figure 6:
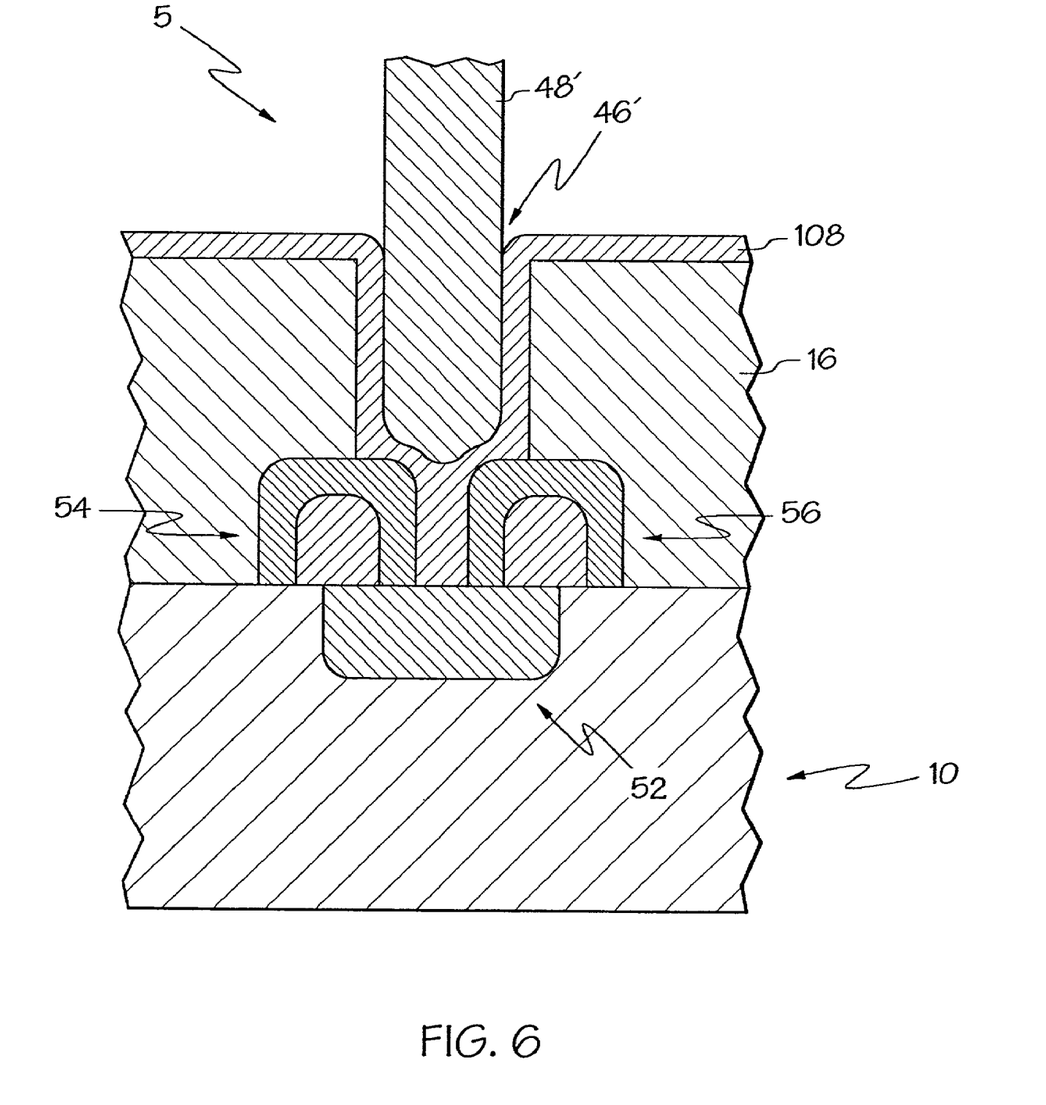
FIG. 6 is a cross sectional illustration of a semiconductor device and its method of fabrication.

Referring now to FIG. 6, a semiconductor device 5 and its method of fabrication are illustrated. The semiconductor device 5 and its method of manufacture are substantially the same as the alternative storage container structure 9 and the corresponding method of manufacture described herein with reference to FIGS. 3A–3H; however, the semiconductor device 5 and the corresponding method of fabrication differ in that a charge storage lamina 50' is not provided in the semiconductor device. Rather, a conductive film 108, e.g. a conductive polysilicon film, replaces the charge storage lamina 50'. In this manner, the electrical contact 48' formed in the contact region 46' is characterized by a low contact resistance because of the extended contact surface area defined between the electrical contact 48' and the conductive film 108. The reduced width of the lower side wall region 80 ensures that, during production of a plurality of semiconductor devices 5 according to the method of the present invention, the conductive film 108 will reliably and consistently occupy respective lower side wall regions 80 and upper side wall regions 82 of each semiconductor device 5 so produced.

Figure 7:
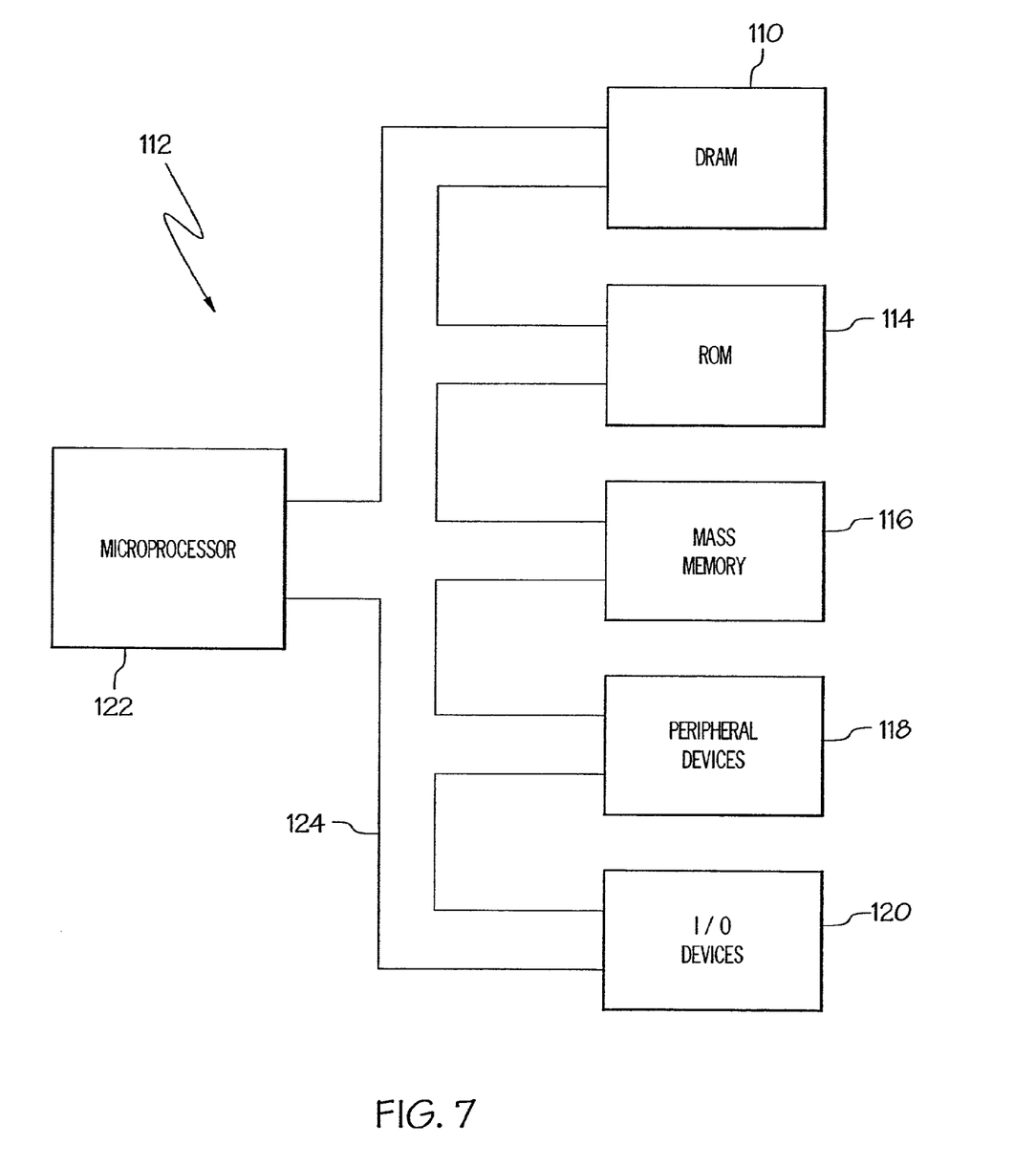
FIG. 7 is a schematic block diagram of a computer system according to the present invention.

Referring now to FIG. 7, it is contemplated by the present invention that the memory device 6, described in detail above with respect to FIG. 4, and the alternative memory device 7 described in detail above with respect to FIG. 5, and their respective methods of fabrication, may be utilized to provide a DRAM chip 110 within a computer system 112. As will be appreciated by those skilled in the art, the computer system 112 would include ROM 114, mass memory 116, peripheral devices 118, and I/O devices 120 in communication with a microprocessor 122 via a data bus 124 or another suitable data communication path. Specifically, referring to the memory device 6, described in detail herein with respect to FIG. 4, the memory device 6 is fabricated substantially as described, and the remainder of the computer system 112 is assembled by providing the components illustrated in FIG. 7 and by providing the microprocessor 122 in communication with a plurality of the storage container structures 8 via respective ones of a plurality of the bit line terminals 102. Similarly, referring to the alternative memory device 7, described in detail herein with respect to FIG. 5, the memory device 7 is fabricated substantially as described, and the remainder of the computer system 112 is assembled by providing the components illustrated in FIG. 7 and by providing the microprocessor 122 in communication with a plurality of the alternative storage container structures 9 via respective ones of a plurality of the bit line terminals 102.

Having described the invention in detail and by reference to preferred embodiments thereof, it will be apparent that modifications and variations are possible without departing from the scope of the invention defined in the appended claims.

What is claimed is:

1. A storage container structure comprising:
    a single layer semiconductor substrate including a doped semiconductor structure;
    a single layer of insulating material disposed over and in contact with said substrate, said insulating material of sufficient depth to include a container region disposed therein, said container region defining a container cross section having container side walls, a container bottom wall, and a container interior bounded in part by said container side walls and said container bottom wall;
    a patterning stop region comprising a doped topographic core, said patterning stop region disposed over and in contact with said substrate such that a substantial entirety of the width of said container region is defined by an upper surface of said patterning stop region;
    a charge storage lamina formed over an interior surface of said container region, said charge storage lamina comprising a first conductive film with at least a portion thereof in contact with said patterning stop region, a second conductive film defining a first surface thereon, and an insulating film disposed intermediate said first and second conductive films;
a contact region defined by said charge storage lamina, wherein said contact region defines a contact region cross section having contact region side walls and a contact region bottom wall, and wherein said contact region side walls and said contact region bottom wall are defined by said first surface of said second conductive film; and
an electrical contact in contact with said first surface of said second conductive film such that said electrical contact and said charge storage lamina occupy collectively at least a portion of said container region.

2. A storage container structure comprising:
a single layer semiconductor substrate including a doped semiconductor structure;
a patterning stop region comprising a doped topographic core, said patterning stop region disposed over and in contact with said substrate such that a substantial entirety of the width of said container region is defined by an upper surface of said patterning stop region;
a single layer of insulating material disposed over and in contact with said substrate;
a container region formed within said insulating material, said container region defining a container cross section having container side walls, a container bottom wall, and a container interior bounded in part by said container side walls and said container bottom wall, wherein all of said container bottom wall is defined by an upper surface of said patterning stop region;
a charge storage lamina formed over an interior surface of said container region, said charge storage lamina comprising a first conductive film with at least a portion thereof in contact with said patterning stop region, a second conductive film defining a first surface thereon, and an insulating film disposed intermediate said first and second conductive films;
a contact region defined by said charge storage lamina, wherein said contact region defines a contact region cross section having contact region side walls and a contact region bottom wall, and wherein said contact region side walls and said contact region bottom wall are defined by a first surface of said charge storage lamina; and
an electrical contact in contact with said first surface of said second conductive film such that said electrical contact and said charge storage lamina occupy collectively at least a portion of said container region.

3. A storage container structure comprising:
a single layer semiconductor substrate including a doped semiconductor structure, said substrate including a generally planar upper surface;
a single layer of insulating material disposed over and in contact with said generally planar upper surface of said substrate, said insulating material including a container region disposed therein, said container region defining a container cross section having container side walls, a container bottom wall, and a container interior bounded in part by said container side walls and said container bottom wall;
a patterning stop region comprising a doped topographic core, said patterning stop region including:
a lower surface disposed over and in contact with said generally planar upper surface of said substrate; and
an upper surface configured such that the lowermost extension of said container bottom wall does not project substantially below said upper surface of said patterning stop region, said upper surface configured such that a substantial entirety of said container cross section is defined by said upper surface;
a charge storage lamina formed over an interior surface of said container region, said charge storage lamina comprising a first conductive film with at least a portion thereof in contact with said patterning stop region, a second conductive film defining a first surface thereon, and an insulating film disposed intermediate said first and second conductive films;
a contact region defined by said charge storage lamina, wherein said contact region defines a contact region cross section having contact region side walls and a contact region bottom wall, and wherein said contact region side walls and said contact region bottom wall are defined by a first surface of said charge storage lamina; and
an electrical contact in contact with said first surface of said second conductive film such that said electrical contact and said charge storage lamina occupy collectively at least a portion of said container region.

4. A storage container structure comprising:
a single layer semiconductor substrate including a doped semiconductor structure, said substrate including a generally planar upper surface;
an insulating material disposed over and in contact with said generally planar upper surface of said substrate, said insulating material including a container region disposed therein, said container region defining a container cross section having container side walls, a container bottom wall, and a container interior bounded in part by said container side walls and said container bottom wall;
a patterning stop region comprising a doped topographic core, said patterning stop region including:
a lower surface in contact with said generally planar upper surface of said substrate; and
an upper surface configured to define a substantial entirety of said container cross section;
a charge storage lamina over an interior surface of said container region, said charge storage lamina comprising a first conductive film with at least a portion thereof in contact with said patterning stop region, a second conductive film defining a first surface thereon, and an insulating film disposed intermediate said first and second conductive films;
a contact region defined by said charge storage lamina, wherein said contact region defines a contact region cross section having contact region side walls and a contact region bottom wall, and wherein said contact region side walls and said contact region bottom wall are defined by a first surface of said charge storage lamina; and
an electrical contact in contact with said first surface of said second conductive film such that said electrical contact and said charge storage lamina occupy collectively at least a portion of said container region.

5. A storage container structure according to claim 4, wherein said upper surface of said patterning stop region is configured such that all of said container bottom wall is defined by said upper surface of said patterning stop region.

* * * * *